(12) United States Patent
Chen et al.

(10) Patent No.: US 11,331,689 B1
(45) Date of Patent: May 17, 2022

(54) METHOD FOR PRODUCING GRAPHENE FILM WITH THERMAL MANAGEMENT FUNCTION

(71) Applicant: GUANGDONG UNIVERSITY OF TECHNOLOGY, Guangzhou (CN)

(72) Inventors: Yun Chen, Guangzhou (CN); Yuanhui Guo, Guangzhou (CN); Yixuan Bu, Guangzhou (CN); Shuquan Ding, Guangzhou (CN); Shengyu Hou, Guangzhou (CN); Junyu Long, Guangzhou (CN); Xun Chen, Guangzhou (CN); Xin Chen, Guangzhou (CN); Jian Gao, Guangzhou (CN)

(73) Assignee: GUANGDONG UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 17/560,464

(22) Filed: Dec. 23, 2021

(30) Foreign Application Priority Data

Dec. 24, 2020 (CN) .......................... 202011554757.7

(51) Int. Cl.
| | |
|---|---|
| *B05D 1/38* | (2006.01) |
| *B05D 3/12* | (2006.01) |
| *B05D 3/06* | (2006.01) |
| *B05C 9/08* | (2006.01) |
| *H05K 1/02* | (2006.01) |
| *C01B 32/194* | (2017.01) |
| *C09D 5/20* | (2006.01) |

(52) U.S. Cl.
CPC ............... *B05C 9/08* (2013.01); *B05D 1/38* (2013.01); *B05D 3/06* (2013.01); *B05D 3/12* (2013.01); *C01B 32/194* (2017.08); *C09D 5/20* (2013.01); *H05K 1/0209* (2013.01)

(58) Field of Classification Search
CPC .... B05D 1/38; B05D 3/06; B05D 3/12; C01B 32/194; C09D 5/20
See application file for complete search history.

(56) References Cited

U.S. PATENT DOCUMENTS

| | | | |
|---|---|---|---|
| 9,314,817 B2 * | 4/2016 | Wong | ...................... H01L 23/42 |
| 9,878,302 B2 * | 1/2018 | Wei | ........................ B01J 20/205 |
| 2020/0086277 A1 * | 3/2020 | Wang | .................... C01B 19/007 |

FOREIGN PATENT DOCUMENTS

| | | |
|---|---|---|
| CN | 104743551 A | 7/2015 |
| CN | 105502350 A | 4/2016 |
| CN | 105800605 A | 7/2016 |

(Continued)

*Primary Examiner* — Michael P Wieczorek

(57) ABSTRACT

This application relates to an apparatus for producing a graphene film with a thermal manipulation function. The apparatus includes a filter cup, a filter flask, a vacuum pump, a fixing clamp, and a laser. The fixing clamp is configured to clamp a first filter membrane and a second filter membrane. The laser is configured to irradiate the first filter membrane. The first filter membrane and the second filter membrane are arranged stackedly. The filter cup and the filter flask are in snap fit up and down. The first filter membrane and the second filter membrane are arranged between the filter cup and the filter flask. The vacuum pump is in communication with the filter flask. This application also provides a method for producing the graphene film with a thermal manipulation function.

6 Claims, 4 Drawing Sheets

(56) References Cited

FOREIGN PATENT DOCUMENTS

| | | | |
|---|---|---|---|
| CN | 106064023 | A | 11/2016 |
| CN | 106442629 | A | 2/2017 |
| CN | 107293377 | A | 10/2017 |
| CN | 110950301 | A | 4/2020 |

* cited by examiner

METHOD FOR PRODUCING GRAPHENE FILM WITH THERMAL MANAGEMENT FUNCTION

CROSS-REFERENCE TO RELATED APPLICATIONS

This application claims the benefit of priority from Chinese Patent Application No. 202011554757.7, filed on Dec. 24, 2020. The content of the aforementioned application, including any intervening amendments thereto, is incorporated herein by reference.

TECHNICAL FIELD

The present application relates to graphene, and more particularly to a method for producing a graphene film with a thermal manipulation function.

BACKGROUND

Thermal energy, everywhere in our daily life, brings many conveniences to human society, as well as many troubles. Heat will be produced during the operation of electronic equipment, and the electronic components are usually sensitive to temperature change. Some electronic components, such as the chip packaging-sealing module, exhibit thermal characteristics that change rapidly with temperature during the operation. The service life and reliability of electronic components generally decline with the increase of the operating temperature. Therefore, the effective heat dissipation is the key to improving the service life and reliability of electronic components, and effective treatment of thermal effects is crucial for the subsequent research and development of electronic components. Thermal manipulation has increasingly become an important part of the electronic packaging.

In recent years, with the rapid development of electronic technology, electronic equipment has been not only used in military fields such as airplanes, satellites, space shuttles, and naval submarines, but also widely used in civilian fields such as industrial production, communication systems, and personal computers. Nevertheless, some contradictions emerge in the development of electronic equipment. Specifically, the electronic equipment is small in size, functional, and highly portable, and has a wide range of environmental adaptability and development needs. However, due to the presence of thermal constraints, it is difficult to achieve the thermal manipulation of the electronic equipment. The current trend of the electronic components is to manufacture powerful devices with the minimal size, which raises higher heat-dissipation requirements for the electronic component packaging. The performance and life cycle of the electronic components are critical. Therefore, the best way to extend the life of these electronic products is to effectively control the temperature therein. In view of this, the heat-dissipation performance plays a vital role in extending the life of the electronic product.

At present, the heat dissipation of electronic components is mainly performed by natural cooling and energy drainage. For instance, the personal computer is generally equipped with a radiator and a fan for heat dissipation. The radiator is generally made of materials with high heat capacities such as aluminum and copper, aiming to absorb more heat at a smaller temperature rise. In this case, a thicker copper foil, a large-sized power device or ground copper foil, or more thermally conductive holes are introduced in the design of the circuit board.

However, the existing heat-dissipation methods cannot achieve the partial heat dissipation, and the heat dissipation efficiency increases with the increase of space occupied by the heat dissipation device. The advancement trend of electronic manufacturing is to manufacture multi-functional devices with the smallest size, but the current heat dissipation method cannot meet the requirements. Therefore, it is urgent to develop a new method to effectively guide and cloak the heat generated by the electronic components and achieve thermal protection while satisfying the need for electronic components to become smaller, lighter, and more portable.

Graphene has excellent thermal conductivity and strength, good toughness and high flexibility, and thus is expected to be used in the thermal protection of electronic components.

SUMMARY

An object of this disclosure is to provide a method for producing a graphene film with a thermal manipulation function to overcome the defects in the prior art, which can achieve thermal protection while satisfying the need for electronic components to become smaller, lighter, and more portable.

Technical solutions of this application are described as follows.

This application provides a method for producing a graphene film with a thermal manipulation function using a processing apparatus, wherein the processing apparatus comprises a filter cup, a filter flask, a vacuum pump, a fixing clamp, and a laser; the fixing clamp is configured to clamp a first filter membrane and a second filter membrane; the laser is configured to irradiate the first filter membrane; the first filter membrane is arranged stackedly on the second filter membrane; the filter cup is in snap fit with the filter flask up and down; the first filter membrane and the second filter membrane are arranged between the filter cup and the filter flask; and the vacuum pump is in communication with the filter flask;

the processing apparatus further comprises an ultrasonic water tank; and the filter flask is arranged in the ultrasonic water tank; and the method comprises:

(S1) subjecting the first filter membrane to laser irradiation to carbonize a region on the first filter membrane outside a target pattern;

(S2) preparing a uniform carbon fiber suspension and a uniform graphene suspension;

(S3) feeding the carbon fiber suspension to the filter cup; and turning on the vacuum pump to perform vacuum filtration to allow a carbon fiber precursor to be deposited on an upper surface of the second filter membrane;

(S4) pouring the graphene suspension into the filter cup; and turning on the vacuum pump to perform vacuum filtration to deposit graphene on the carbon fiber precursor to obtain a graphene film;

(S5) sticking the first filter membrane and the second filter membrane to a glass substrate, followed by drying in a vacuum drying oven;

(S6) cooling the first filter membrane and the second filter membrane; and peeling the graphene film from the second filter membrane; and (S7) arranging the graphene film on a region that needs thermal manipulation though covering or embedding into a circuit board.

In some embodiments, in step (S1), the laser irradiation is performed under a laser wavelength of 355 nm and a laser power of 10 W until the region on the first filter membrane outside the target pattern is carbonized to be electrically conductive.

In some embodiments, in step (S2), the carbon fiber suspension is prepared through steps of:

pouring deionized water into a beaker containing a carbon fiber with a length of 1-5 mm, followed by ultrasonic treatment for 30 min to produce the carbon fiber suspension; wherein a weight ratio of the deionized water to the carbon fiber is 3000-5000:1.

In some embodiments, in step (S2), the graphene suspension is prepared through steps of:

pouring deionized water into a beaker containing a flash graphene followed by ultrasonic treatment for 30 min to produce the graphene suspension; wherein a weight ratio of the deionized water to the flash graphene is 3000-4000:1.

In some embodiments, in step (S5), the drying is performed at 55-65° C. for 50 min.

In some embodiments, in steps (S3) and (S4), the processing apparatus is subjected to ultrasonic treatment during the vacuum filtration.

In some embodiments, in step (S1), the target pattern has a thermal cloak function, a thermal rotation function, or a thermal concentration function.

The beneficial effects of this application are described below.

In the method provided herein, a target pattern with a thermal manipulation function is formed on a graphene film, and the pattern can be adjusted according to the specific application environment or region requiring the thermal-control, and targetedly arranged on regions that need thermal manipulation to realize thermal cloak, thermal rotation and thermal concentration in a specific area, improving the pertinence and accuracy of thermal manipulation, and enhancing the flexibility of the thermal manipulation. The use of graphene to realize thermal manipulation can realize the minimization of heat-dissipation structures, and further meet the requirements of simple equipment, easy operation, low cost, high precision, and high flexibility. The graphene prepared herein can be applied to electronic components that are small-sized, light, and thermally sensitive, and require higher targeted protection, and thus has a promising application prospect.

BRIEF DESCRIPTION OF THE DRAWINGS

The present disclosure will be described below with reference to the drawings and embodiments.

Figure 1:
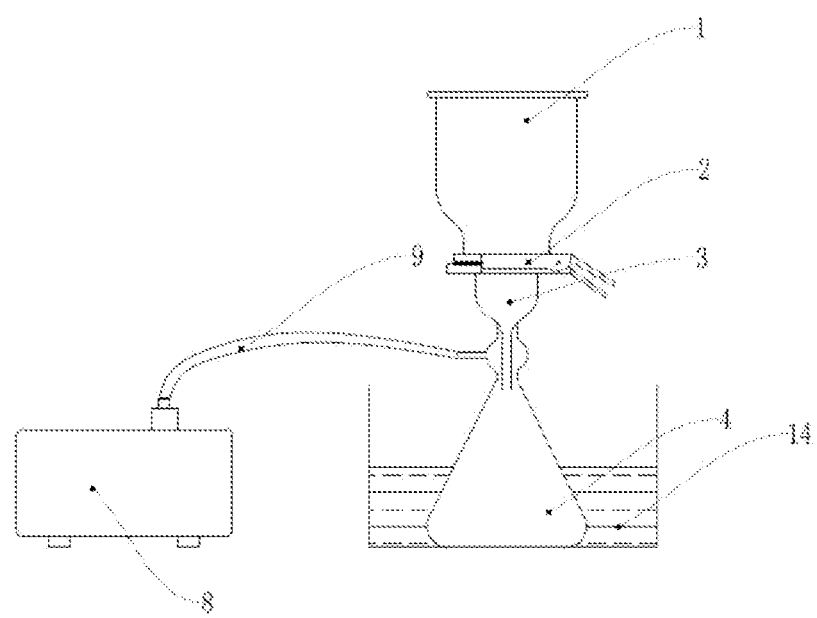
FIG. 1 is an overall structural diagram of a processing apparatus according to an embodiment of the present disclosure.

In the drawing, 1, filter cup; 2, fixing clamp; 3, base; 4, filter flask; 5, second filter membrane; 6, first filter membrane; 7, laser; 8, vacuum pump; 9, hose; 10, heat-generating region; 11, first thermosensitive electronic component arrangement region; 12, second thermosensitive electronic component arrangement region; and 14, ultrasonic water tank.

DETAILED DESCRIPTION OF EMBODIMENTS

The technical solutions of the present disclosure will be further described below by reference to the drawings and embodiments.

Figure 2:
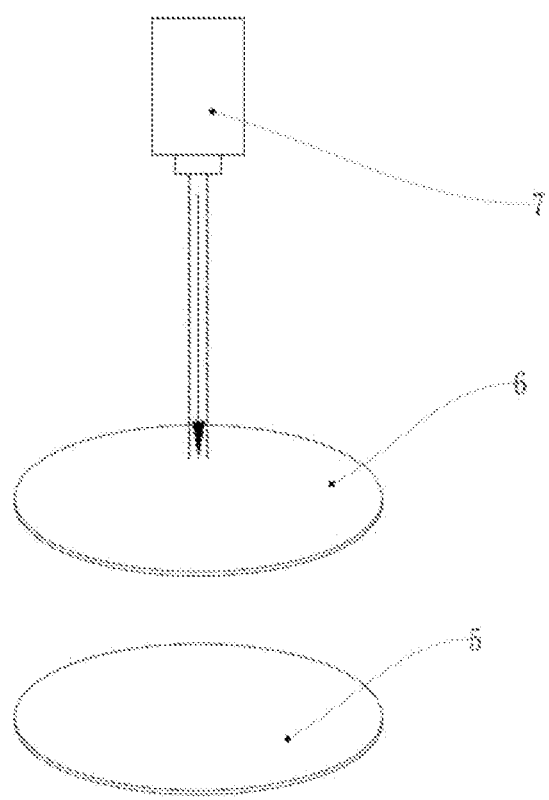
FIG. 2 schematically shows the laser irradiation to a first filter membrane.
Figure 3:
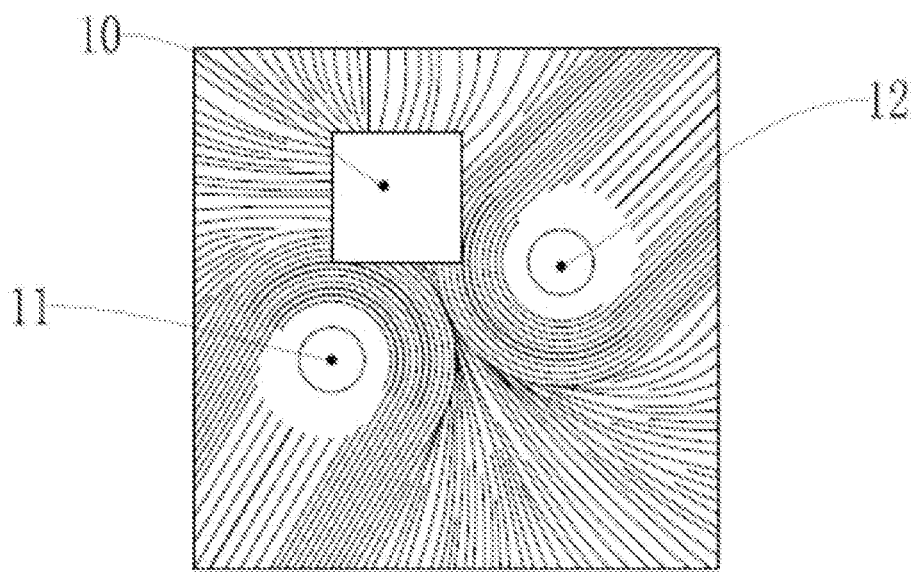
FIG. 3 is a structural diagram of a graphene film with a thermal manipulation function according to an embodiment of the present disclosure.

As shown in FIGS. 1-3, an apparatus provided herein for producing a graphene film with a thermal manipulation function includes a filter cup 1, a filter flask 4, a vacuum pump 8, a fixing clamp 2, and a laser 7. The fixing clamp 2 is configured to clamp a first filter membrane 6 and a second filter membrane 5. The laser 7 is configured to irradiate the first filter membrane 6. The first filter membrane 6 is arranged stackedly on the second filter membrane 5. The filter cup 1 is in snap fit with the filter flask 4 up and down. The vacuum pump 8 is in communication with the filter flask 4.

The first filter membrane 6 and the second filter membrane 5 are water-based filter membranes with a pore size of 0.22 μm or 0.45 μm and a layer of polydimethylsiloxane (PDMS) on the surface. The first filter membrane 6 can form a thermal manipulation pattern under the irradiation of the laser 7. The first filter membrane 6 and the second filter membrane 5 arranged stackedly are configured to deposit a graphene film with a thermal manipulation pattern. The first filter membrane 6 and the second filter membrane 5 are arranged between the filter cup 1 and the filter flask 4. The vacuum pump 8 and the filter flask 4 are connected through the hose 9. Therefore, the filtration and deposition process can be accelerated through the vacuum pump 8. To stabilize the first filter membrane 6 and the second filter membrane 5 during the filtration, the fixing clamp 2 is configured to clamp the first filter membrane 6 and the second filter membrane 5. Preferably, a base 3 is arranged between the first filter membrane 6 and the second filter membrane 5 and configured to place the first filter membrane 6 and the second filter membrane 5.

In some embodiments, the processing apparatus further includes an ultrasonic water tank 14. The filter flask 4 is arranged in the ultrasonic water tank 14.

The ultrasonic water tank 14 is subjected to ultrasonic treatment during the filtration to make the suspension more uniform and deposit a graphene film with a uniform thickness.

Figure 4:
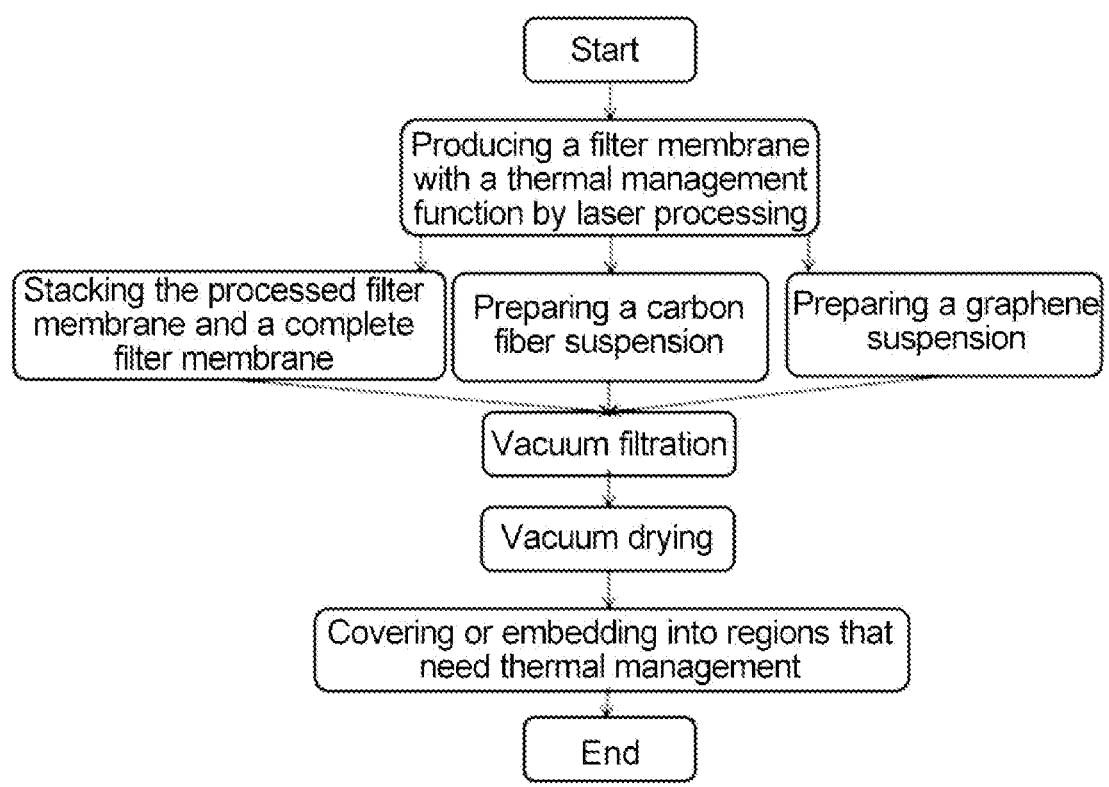
FIG. 4 is a flow chart of a method for producing a graphene film with a thermal manipulation function according to an embodiment of the present disclosure.

As shown in FIG. 4, a method for producing a graphene film with a thermal manipulation function is provided, which includes the following steps.

(S1) The first filter membrane 6 arranged stackedly on the second filter membrane is subjected to laser irradiation to carbonize a region on the first filter membrane 6 outside a target pattern.

(S2) A uniform carbon fiber suspension and a uniform graphene suspension are prepared.

(S3) The carbon fiber suspension is fed to the filter cup 1. The vacuum pump 8 is turned on to perform vacuum filtration to allow a carbon fiber precursor to be deposited on an upper surface of the second filter membrane 5.

(S4) The graphene suspension is poured into the filter cup 1. The vacuum pump 8 is turned on to perform vacuum filtration to deposit graphene on the carbon fiber precursor to obtain a graphene film.

(S5) The first filter membrane 6 and the second filter membrane 5 are stuck to a glass substrate, followed by drying in a vacuum drying oven.

(S6) The first filter membrane 6 and the second filter membrane 5 are cooled. Then the graphene film is peeled from the second filter membrane 5.

(S7) The graphene film is arranged on a region that needs thermal manipulation though covering or embedding into a circuit board.

The carbonized region on the first filter membrane 6 is deprived of filtering ability such that the patterned carbon fiber precursor and graphene film will be deposited on the second filter membrane 5. Moreover, there is no adhesion between the second filter membrane 5 and the graphene film due to a layer of PDMS on the surface of the first filter membrane 6 and the second filter membrane 5. After the vacuum filtration, the graphene film and the second filter membrane 5 are stuck together owing to moisture. After cooling by vacuum drying, the graphene film and the second filter membrane 5 are directly separated. If there is a small area of adhesion, a glass sheet is used to tap the graphene film off. In this way, the graphene film with thermal manipulation patterns can be produced. The principle of thermal manipulation is described as follows. As shown in FIG. 3, the obtained graphene film is composed of a preset heat-generating region 10, a first thermosensitive electronic component arrangement region 11, a second thermosensitive electronic component arrangement region 12, and textures between the three regions. Different thermal conductivity materials can alternately realize energy grooming, as a result, the heat emitted by the component in the heat-generating region 10 is likely or less likely to affect the first thermosensitive electronic component arrangement region 11 and the second thermosensitive electronic component arrangement region 12.

In some embodiments, in step (S1), the laser irradiation is performed under an ultraviolet laser with a wavelength of 355 nm and a laser power of 10 W until the region on the first filter membrane 6 outside a target pattern is carbonized to be electrically conductive.

The reason why the ultraviolet laser is applied instead of an infrared laser is that the carbonization by the infrared laser tends to damage the edge of the pattern due to the generated high heat, leading to plastic deformation. For example, the filter paper processed by the infrared laser will produce a fine deformation. Thus, the infrared laser can only be used in cases requiring a lower accuracy. Compared with the infrared laser, most materials are prone to absorb the ultraviolet laser, widening the range of materials that can be processed by the ultraviolet laser. The ultraviolet laser process materials by breaking molecular bonds, of which short wavelengths can be configured to process subtle components. In this embodiment, the laser power is 10 W, the processing current is 40% (if the processing current is too high, the material will be directly etched), and the number of laser marking is 1 time. The standard of carbonization is that the material is conductive and the square resistance of the carbonization part is less than part 30 $\Omega \cdot m$.

In some embodiments, in step (S2), the carbon fiber suspension is prepared through the following steps. Deionized water is poured into a beaker containing a carbon fiber with a length of 1-5 mm, followed by ultrasonic treatment for 30 min to obtain the carbon fiber suspension, where a weight ratio of the deionized water to the carbon fiber is 3000-5000:1.

The length of the carbon fiber is 1-5 mm such that the carbon fiber can be evenly dispersed in water and can build a carbon network with a better toughness. If the carbon fiber is too long, it will less likely to be uniformly dispersed in the water, and the deposited carbon fiber layer will be uneven, resulting in uneven performance of the graphene film.

In some embodiments, in step (S2), the graphene suspension is prepared through the following steps. Deionized water is poured into a beaker containing a flashed graphene, followed by ultrasonic treatment for 30 min to produce the graphene suspension, where a weight ratio of the deionized water to the flashed graphene is 3000-4000:1.

A Joule flashed graphene is selected as it can be processed on a large scale and produced in a low cost.

In some embodiments, in step (S5), the drying is performed at 55-65° C. for 50 min.

It has been found by experiments that the optimal temperature is 60° C. The thermal conductivity of the graphene film upgrades with the increase of holes in the graphene film. During the drying of the graphene film, the water inside the graphene film escapes in the form of water vapor, leaving holes in the graphene film. The number of holes generated at a low drying temperature is lower. If the drying temperature is too high, defects such as cracks will appear on the surface of the graphene film, and the amount of moisture existed in the graphene film is not enough to allow the graphene film to remain attached to the filter membrane after cooling.

In some embodiments, in steps (S3) and (S4), the processing apparatus is subjected to ultrasonic treatment during the vacuum filtration.

During the vacuum filtration, the concentration of the graphene suspension suddenly increases, leading to the agglomeration of graphene. Therefore, the graphene suspension is subjected to ultrasonic treatment to be dispersed evenly. After the graphene film is formed, the ultrasonic treatment stops.

In some embodiments, in step (S1), the target pattern has a thermal cloak function, a thermal rotation function, or a thermal concentration function.

Described above are merely preferred embodiments of this application, which are not intended to limit this application. It should be understood that any changes, replacements and modifications made by those skilled in the art without departing from the spirit of this application shall fall within the scope of this application defined by the appended claims.

What is claimed is:

1. A method for producing a graphene film with a thermal manipulation function using a processing apparatus, the processing apparatus comprising a filter cup, a filter flask, a vacuum pump, a fixing clamp and a laser; the fixing clamp being configured to clamp a first filter membrane and a second filter membrane; the laser being configured to irradiate the first filter membrane; the first filter membrane being arranged stackedly on the second filter membrane; the filter cup being in snap fit with the filter flask up and down; the first filter membrane and the second filter membrane being arranged between the filter cup and the filter flask; and the vacuum pump being in communication with the filter flask;

the processing apparatus further comprising an ultrasonic water tank; and the filter flask being arranged in the ultrasonic water tank; and the method comprising:

(S1) subjecting the first filter membrane to laser irradiation to carbonize a region on the first filter membrane outside a target pattern;

(S2) preparing a uniform carbon fiber suspension and a uniform graphene suspension;

(S3) feeding the carbon fiber suspension to the filter cup; and turning on the vacuum pump to perform vacuum filtration to allow a carbon fiber precursor to be deposited on an upper surface of the second filter membrane;

(S4) pouring the graphene suspension into the filter cup; and turning on the vacuum pump to perform vacuum filtration to deposit graphene on the carbon fiber precursor to obtain a graphene film;

(S5) sticking the first filter membrane and the second filter membrane to a glass substrate, followed by drying in a vacuum drying oven;

(S6) cooling the first filter membrane and the second filter membrane; and peeling the graphene film from the second filter membrane; and (S7) arranging the graphene film on a region that needs thermal manipulation though covering or embedding into a circuit board;

wherein in step (S1), the laser irradiation is performed under a laser wavelength of 355 nm and a laser power of 10 W until the region on the first filter membrane outside the target pattern is carbonized to be electrically conductive.

2. The method of claim 1, wherein in step (S2), the carbon fiber suspension is prepared through steps of:

pouring deionized water into a beaker containing a carbon fiber with a length of 1-5 mm, followed by ultrasonic treatment for 30 min to produce the carbon fiber suspension; wherein a weight ratio of the deionized water to the carbon fiber is 3000-5000:1.

3. The method of claim 1, wherein in step (S2), the graphene suspension is prepared through steps of:

pouring deionized water into a beaker containing a flash graphene followed by ultrasonic treatment for 30 min to produce the graphene suspension; wherein a weight ratio of the deionized water to the flash graphene is 3000-4000:1.

4. The method of claim 1, wherein in step (S5), the drying is performed at 55-65° C. for 50 min.

5. The method of claim 1, wherein in steps (S3) and (S4), the processing apparatus is subjected to ultrasonic treatment during the vacuum filtration.

6. The method of claim 1, wherein in step (S1), the target pattern has a thermal cloak function, a thermal rotation function, or a thermal concentration function.

* * * * *